United States Patent
Campbell et al.

(10) Patent No.: US 7,787,248 B2
(45) Date of Patent: Aug. 31, 2010

(54) MULTI-FLUID COOLING SYSTEM, COOLED ELECTRONICS MODULE, AND METHODS OF FABRICATION THEREOF

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1101 days.

(21) Appl. No.: 11/426,423

(22) Filed: Jun. 26, 2006

(65) Prior Publication Data

US 2007/0295480 A1    Dec. 27, 2007

(51) Int. Cl.
*H05K 7/20* (2006.01)
*F28F 7/00* (2006.01)
*H01B 9/06* (2006.01)
*F25D 23/12* (2006.01)
*B05B 7/06* (2006.01)

(52) U.S. Cl. .............. 361/700; 361/699; 257/714; 257/715; 165/80.4; 165/80.5; 165/104.33; 165/908; 174/15.1; 62/64; 62/259.2; 239/424; 239/549

(58) Field of Classification Search ......... 361/699–700; 257/714, 715; 165/80.4–80.5, 104.33, 908; 174/15.1; 239/423, 424, 549
See application file for complete search history.

(56) References Cited

U.S. PATENT DOCUMENTS 2,928,409 A    3/1960    Johnson et al. ............... 137/82

(Continued)

FOREIGN PATENT DOCUMENTS

JP    2001-050164 A    2/2001

OTHER PUBLICATIONS

Campbell et al., "Cooling Apparatus, Cooled electronic Module and Methods of Fabrication Thereof Employing a Thermally Conductive Return Manifold Structure Sealed to the Periphery of a Surface to be Cooled", U.S. Serial no. 11/420,421, filed May 25, 2006.

(Continued)

*Primary Examiner*—Zachary M Pape
(74) *Attorney, Agent, or Firm*—Geraldine Monteleone, Esq.; Kevin P. Radigan, Esq.; Heslin Rothenberg Farley & Mesiti P.C.

(57) ABSTRACT

A multi-fluid cooling system and methods of fabrication thereof are provided for removing heat from one or more electronic devices. The cooling system includes a multi-fluid manifold structure with at least one first fluid inlet orifice and at least one second fluid inlet orifice for concurrently, separately injecting a first fluid and a second fluid onto a surface to be cooled when the cooling system is employed to cool one or more electronic devices, wherein the first fluid and the second fluid are immiscible, and the first fluid has a lower boiling point temperature than the second fluid. When the cooling system is employed to cool the one or more electronic devices and the first fluid boils, evolving first fluid vapor condenses in situ by direct contact with the second fluid of higher boiling point temperature.

14 Claims, 5 Drawing Sheets

U.S. PATENT DOCUMENTS

| | | | |
|---|---|---|---|
| 3,029,743 A | 4/1962 | Johns | |
| 3,406,244 A | 10/1968 | Oktay | 174/15 |
| 3,417,814 A | 12/1968 | Oktay | 165/105 |
| 3,520,641 A | 7/1970 | Casey et al. | 417/412 |
| 3,606,592 A | 9/1971 | Madruski et al. | 417/413 |
| 4,468,177 A | 8/1984 | Strimling | 417/413 |
| 4,524,466 A | 6/1985 | Hall et al. | 603/3 |
| 4,648,807 A | 3/1987 | Tippetts et al. | 417/322 |
| 4,697,989 A | 10/1987 | Perlov et al. | 417/53 |
| 4,715,435 A | 12/1987 | Foret | |
| 4,939,405 A | 7/1990 | Okuyama et al. | 310/330 |
| 5,094,594 A | 3/1992 | Brennan | 417/322 |
| 5,131,233 A | 7/1992 | Cray et al. | 62/64 |
| 5,215,446 A | 6/1993 | Takahashi et al. | 417/322 |
| 5,338,164 A | 8/1994 | Sutton et al. | |
| 5,914,856 A | 6/1999 | Morton et al. | 361/690 |
| 6,558,127 B2 | 5/2003 | Maruyama et al. | 417/44.1 |
| 6,565,333 B2 | 5/2003 | Maruyama | 417/417 |
| 6,741,464 B2 | 5/2004 | Kitano et al. | 361/687 |
| 6,884,040 B2 | 4/2005 | Dooley | 417/53 |
| 6,940,712 B2 | 9/2005 | Chu et al. | 361/679 |
| 6,987,668 B2 | 1/2006 | Kitano | 361/687 |
| 2002/0025260 A1 | 2/2002 | Maruyama | 417/322 |
| 2002/0175596 A1 | 11/2002 | Garimella et al. | 310/328 |
| 2003/0173873 A1 | 9/2003 | Bryant et al. | 310/365 |
| 2004/0042915 A1 | 3/2004 | Rife et al. | 417/321 |
| 2004/0168447 A1 | 9/2004 | Sugito et al. | 62/114 |
| 2005/0121171 A1 | 6/2005 | Mukasa et al. | |
| 2005/0219288 A1 | 10/2005 | Vogeley et al. | 347/10 |
| 2005/0219302 A1 | 10/2005 | Vogeley | 347/19 |
| 2005/0225201 A1 | 10/2005 | Vogeley | 310/317 |
| 2005/0225202 A1 | 10/2005 | Vogeley et al. | 310/317 |
| 2006/0016581 A1 | 1/2006 | Wang et al. | 165/104.33 |
| 2006/0104031 A1 | 5/2006 | Colgan et al. | 361/699 |
| 2007/0153480 A1* | 7/2007 | Zhang et al. | 361/700 |
| 2007/0295481 A1 | 12/2007 | Campbell et al. | |

OTHER PUBLICATIONS

Office Action for U.S. Appl. No. 11/426,431 (U.S. Patent Publication No. 2007/0295481 Al), dated Jan. 5, 2010.

* cited by examiner

MULTI-FLUID COOLING SYSTEM, COOLED ELECTRONICS MODULE, AND METHODS OF FABRICATION THEREOF

CROSS-REFERENCE TO RELATED APPLICATION

This application contains subject matter which is related to the subject matter of the following application, which is assigned to the same assignee as this application and which is hereby incorporated herein by reference in its entirety:

"Dual-Chamber Fluid Pump for a Multi-Fluid Electronics Cooling System and Method", Campbell et al., U.S. Ser. No. 11/426,431, filed Jun. 26, 2006, and published Dec. 27, 2007 as U.S. Patent Publication No. 2007/0295481 A 1.

TECHNICAL FIELD

The present invention relates generally to heat transfer mechanisms, and more particularly, to cooling systems, cooled electronic modules and methods of fabrication thereof for removing heat generated by one or more electronic devices. Still more particularly, the present invention relates to multi-fluid cooling systems and methods of cooling one or more electronic devices.

BACKGROUND OF THE INVENTION

As is known, operating electronic devices produce heat. This heat must be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Air cooling techniques are inherently limited in their ability to extract heat from an electronic device with high power density.

SUMMARY OF THE INVENTION

The need to cool current and future high heat load, high heat flux electronic devices requires development of aggressive thermal management techniques, such as liquid impingement approaches to cool the electronic devices. The concepts disclosed herein address this continuing need for enhanced fluid-based cooling systems and methods of cooling.

Briefly summarized, the present invention comprises in one aspect a cooling system for cooling at least one electronic device. The cooling system includes a multi-fluid manifold structure comprising at least one first fluid inlet orifice and at least one second fluid inlet orifice for concurrently separately injecting a first fluid and a second fluid onto a surface to be cooled when the cooling system is employed to cool the at least one electronic device. The first fluid and the second fluid are immiscible, with the first fluid having a lower boiling point temperature than the second fluid, and wherein when the cooling system is employed to cool the at least one electronic device and the first fluid boils, evolving first fluid vapor condenses by direct contact with the second fluid of higher boiling point temperature.

More particularly, the at least one first fluid inlet orifice and the at least one second fluid inlet orifice are concentric, and when the first fluid boils, the resultant first fluid vapor condenses in situ over the surface to be cooled by direct contact with the second fluid of higher boiling point temperature. In one embodiment, the multi-fluid manifold structure includes a plurality of first fluid inlet orifices and a plurality of second fluid inlet orifices. Each first fluid inlet orifice is concentric with a respective second fluid inlet orifice, and each second fluid inlet orifice is an annular orifice surrounding the respective first fluid inlet orifice.

In a further aspect, the at least one first fluid inlet orifice comprises at least one first fluid inlet jet orifice and the at least one second fluid inlet orifice comprises at least one second fluid inlet jet orifice, wherein the first fluid and second fluid inlet jet orifices provide continuous concurrent jet impingement of the first fluid and the second fluid onto the surface to be cooled. In one embodiment, the first fluid is one of a fluorocarbon or refrigerant, and the second fluid is water. The at least one electronic device can be at least one of an integrated circuit chip, multiple integrated circuit chips, an electronic component or multiple electronic components.

Still more particularly, the first fluid and the second fluid have different densities, and the surface to be cooled is aligned within a range of ±10° of a vertical orientation. In this implementation, the cooling system further includes a multi-fluid outlet in a lower region of the multi-fluid manifold structure through which an effluent comprising the first fluid and the second fluid is withdrawn after contacting the surface to be cooled. The cooling system further includes a return line coupling the multi-fluid outlet to a separation tank where the first fluid and the second fluid in the effluent separate, based on their immiscibility and different densities, for subsequent return to the multi-fluid manifold structure. A first pump pumps the first fluid from the separation tank through a first heat exchanger to the multi-fluid manifold structure and a second pump pumps the second fluid from the separation tank through a second heat exchanger to the multi-fluid manifold structure. The first fluid leaving the first heat exchanger may have a same or different temperature than the second fluid leaving the second heat exchanger. Further, the first fluid and the second fluid may have different mass flow rates when injected onto the surface to be cooled.

In another aspect, a cooled electronic module is provided. The cooled electronic module includes a substrate, at least one electronic device coupled to the substrate, and a cooling system for cooling the at least one electronic device. The cooling system includes a multi-fluid manifold structure coupled to the substrate. The multi-fluid manifold structure has at least one first fluid inlet orifice and at least one second fluid inlet orifice for concurrently separately injecting a first fluid and a second fluid onto a surface to be cooled of the at least one heat-generating electronic device. The first fluid and the second fluid are immiscible, with the first fluid having a lower boiling point temperature than the second fluid, and wherein when the cooling system is employed to cool the at least one electronic device and the first fluid boils, evolving first fluid vapor condenses by direct contact with the second fluid of higher boiling point temperature.

In a further, aspect, the present invention comprises a method of fabricating a cooled electronic module which includes: providing a substrate with at least one electronic device coupled to a surface of the substrate, and having a surface to be cooled; and providing a cooling system for cooling the at least one electronic device. Providing the cooling system includes: providing and coupling a multi-fluid manifold structure to the substrate to define a chamber within which the surface to be cooled is disposed. The multi-fluid manifold structure includes at least one first fluid inlet orifice and at least one second fluid inlet orifice disposed for concurrently separately injecting a first fluid and a second fluid, respectively, onto the surface to be cooled. The first fluid and the second fluid are immiscible, with the first fluid having a lower boiling point temperature than the second fluid, and wherein when the cooling system is employed to cool the at least one electronic device and the first fluid boils, evolving first fluid vapor condenses by direct contact with the second fluid of higher boiling point temperature.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
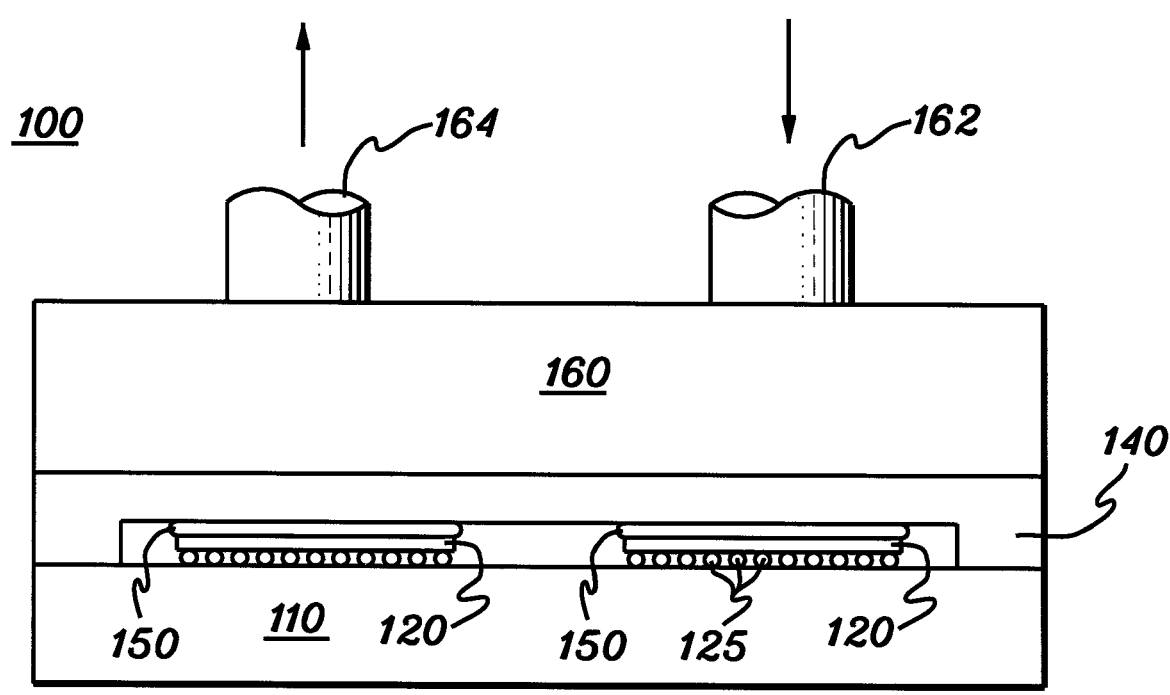
FIG. 1 is a cross-section elevational view of one embodiment of an indirect fluid cooling approach for an electronic module, in accordance with an aspect of the present invention.

As used herein "electronic device" comprises any heat generating electronic component of a computer system or other electronic system requiring cooling. In one example, the electronic device is or includes one or more integrated circuit chips, and/or electronic components. The term "cooled electronic module" includes any electronic module with cooling and at least one electronic device, with single-chip modules and multi-chip modules being examples of a cooled electronic module as described herein. The "surface to be cooled" refers to a surface of one or more electronic devices, or to an exposed surface of a thermal cap, thermal spreader, passivation layer, or other surface in contact with the one or more electronic devices, and through which heat generated by the electronic device(s) is to be extracted.

Generally stated, provided herein are enhanced cooling systems and methods of cooling which allow for high heat transfer from a surface of an electronic device to be cooled using a direct multi-fluid impingement approach. As explained further below, the multi-fluid coolants include a first fluid (i.e., first liquid) and a second fluid (i.e., second liquid) which are immiscible and have different densities. Additionally, the first fluid has a significantly lower boiling point temperature than the second fluid. For example, a boiling point temperature difference in a range of 40° C. to 70° C. could be employed. By way of further example, the first fluid may comprise a fluorocarbon, a segregated hydrofluoroether (HFE) or a refrigerant liquid, and the second fluid water. However, the concepts disclosed herein are readily adapted for use with any combination of coolants meeting the above-outlined constraints.

In one aspect, the cooling system disclosed herein includes a multi-fluid manifold structure comprising at least one first fluid inlet orifice and at least one second fluid inlet orifice for concurrently, separately injecting a first fluid and a second fluid in close association with one another onto a surface to be cooled when the cooling system is employed to cool at least one electronic device. Again, the first fluid and the second fluid are immiscible and the first fluid has a lower boiling point temperature (e.g., a significantly lower boiling point temperature) than the second fluid. When the cooling system is employed to cool one or more electronic devices and the first fluid boils, evolving first fluid vapor condenses in situ over the surface to be cooled by direct contact with the second fluid of higher boiling point temperature.

As noted above, performance of computers continues to increase in both speed and function. Heat dissipated by electronic devices (and in particular, processor chips) is increasing correspondingly. Processor chips with an average heat flux of more than 100 W/cm$^2$ and a "hotspot" heat flux approaching 300 W/cm$^2$ are already being considered, and within the next few years these heat flux levels could approach 200 and 450 W/cm$^2$, respectively. The chip heat loads under consideration already exceed the capability of even the most effective air cooling apparatuses. Projected chip heat loads are likely even to exceed the capability of water cooling approaches with a cold plate attached at either the module or chip level.

One cooling solution for addressing high heat fluxes on electronic devices is indirect liquid cooling via a cold plate, as shown by the example of FIG. 1. In this example, the cooled electronic module 100 includes a substrate 110 having multiple electronic devices 120 (such as integrated circuit chips) disposed thereon. Substrate 110 may include conductive wiring (not shown) on an upper surface thereof and/or imbedded therein, and electronic devices 120 are shown electrically connected to the wiring of substrate 110 via, for example, solder ball or C4 connections 125. A module lid 140, which is fabricated of a thermally conductive material, encases electronic devices 120 within module 100 and is interfaced to the electronic devices via a first thermal interface material 150.

Mechanically coupled to module lid 140 is a cold plate 160 through which coolant flows via an inlet 162 and an outlet 164. By way of example, the coolant employed is liquid water. In this embodiment, module lid 140 functions as a second thermal interface material coupling cold plate 160 to electronic devices 120 to be cooled.

While the embodiment of FIG. 1 is significant and accommodates much higher electronic device heat flux than possible with air-based cooling, the approach is constrained in the heat flux that can be handled due to the various thermal conduction resistances (e.g., of the electronic devices themselves, the first thermal interface material, the second thermal interface material, and the cold plate) the heat must overcome in its path from the heat sources on the active side of the electronic devices to water flowing through the cold plate.

One alternative that eliminates most of these conduction resistances and accommodates higher device heat flux is direct immersion cooling. For example, direction immersion cooling with fluorocarbon coolant may be employed as liquid jets impinging on the electronic devices. However, at higher heat fluxes, coolant boiling will occur and be accompanied by a net generation of vapor. While the boiling mode of heat transfer is a very effective mode of heat transfer, at higher heat flux levels too much vapor may be generated, forming an insulative barrier, and leading to a thermal runaway condition with excessive temperatures occurring. Also, the vapors generated must be condensed before coolant is returned to the pump in a closed loop system.

Thus, disclosed herein is an enhanced cooling approach which allows for greater heat transfer to the coolant from the one or more electronic devices than possible using either of the above-outlined approaches. Advantageously, the cooling approach described herein boosts critical heat flux of a first fluid (such as a fluorocarbon liquid jet) impinging on the surface to be cooled, employs the advantage of a low boiling point temperature liquid coolant (i.e., employs the greater heat transfer attained with a coolant phase change), and provides in situ contact condensation of evolving first fluid vapors (e.g., fluorocarbon vapors) over the surface to be cooled, thus eliminating any need for an external condenser.

Figure 2:
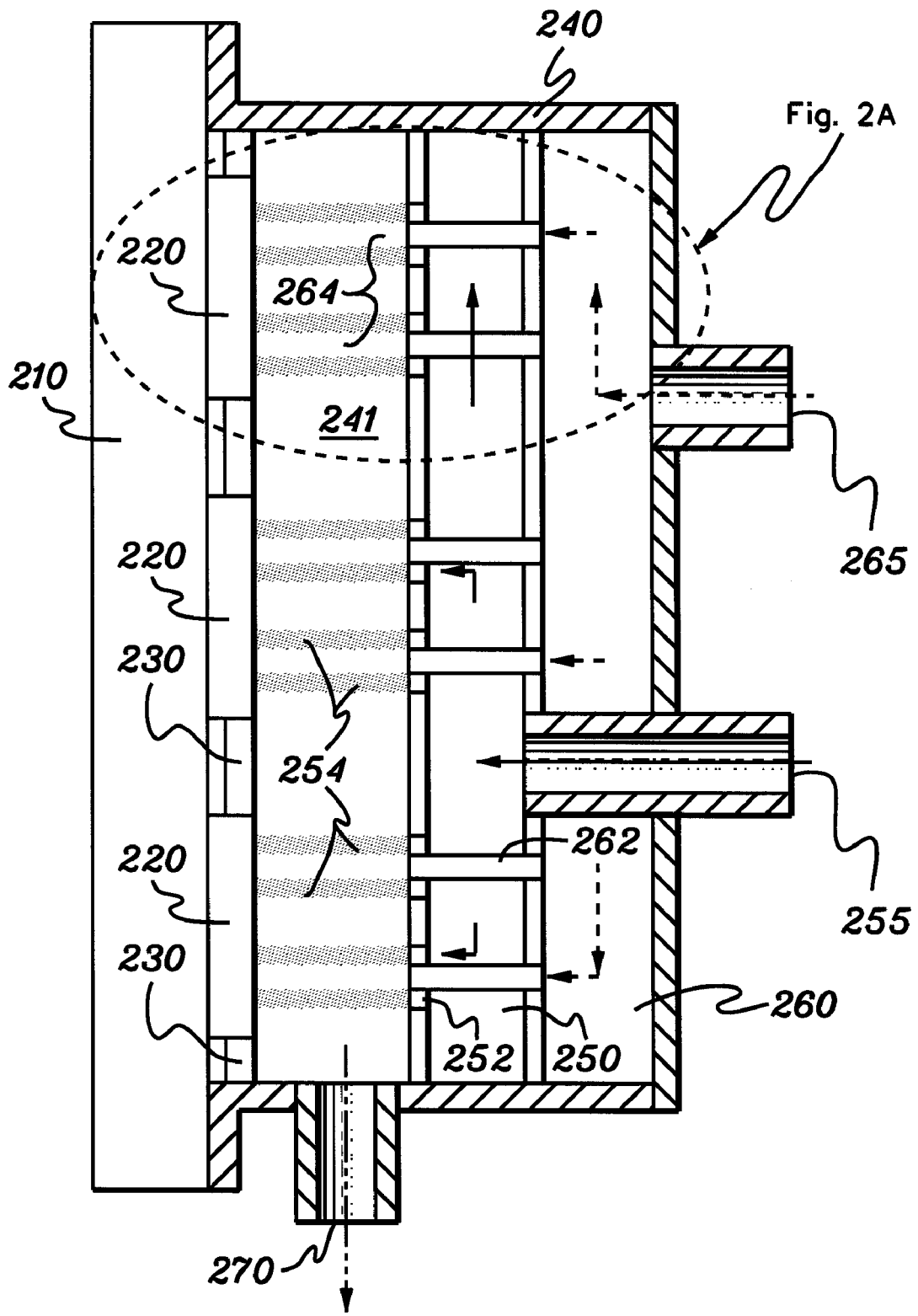
FIG. 2 depicts one embodiment of a cooled electronic module, comprising multiple electronic devices and a multi-fluid manifold structure of a cooling system, in accordance with an aspect of the present invention.

FIG. 2 depicts a cooled electronic module, generally denoted 200, which includes multiple electronic devices 220 to be cooled. Electronic devices 220 reside on a substrate 210, which includes conductive wiring on an upper surface thereof and/or imbedded therein. Electronic devices 220 are electrically connected to the wiring of substrate 210 via, for example, solder ball or C4 connections 225 (see FIG. 3). A seal plate or barrier 230 surrounds the electronic devices and functions to isolate the active circuit portions of the electronic devices, as well as the connections between the electronic devices and the substrate surface metallurgy, from coolant within the module. Seal plate 230 is, in one example, a thin seal plate (or membrane) which separates the coolant or liquid space above the back surfaces of the electronic devices from the dry volume surrounding the front surfaces of the electronic devices (e.g., the C4 interconnect regions in the top surface of the substrate). By way of example, various seal plate embodiments are described in U.S. Pat. No. 6,940,712, issued Sep. 6, 2005 to Chu et al., entitled "Electronic Device Substrate Assembly with Multi-Layer Impermeable Barrier and Method of Making"; as well as U.S. Patent Application Publication No. US 2006/0104031 A1, published May 18, 2006 by Colgan et al., entitled "Fluidic Cooling Systems and Methods for Electronic Components"; and U.S. patent application Ser. No. 11/420,421, filed May 25, 2006 by Campbell et al., entitled "Cooling Apparatus, Cooled Electronic Module and Methods of Fabrication Thereof Employing a Thermally Conductive Return Manifold Structure Sealed to the Periphery of a Surface to be Cooled", each of which is hereby incorporated herein by reference in its entirety. Other techniques for isolating the active circuit portion of the electronic devices from the liquid space above the back surfaces of the devices will be apparent to one of ordinary skill in the art.

As a specific example, the concepts of the present invention are described hereinbelow with reference to the first fluid being a fluorocarbon or segregated hydrofluoroether liquid (e.g., FC-86, FC-87, FC-72, HFE-7000, HFE-7100, or HFE-7200, each available from 3M Corporation) and the second fluid being water. Fluorocarbon liquid boils at 30°-56° C. at atmospheric pressure, while water boils at 100° C. Further, in the examples described herein, the first fluid and the second fluid are injected onto the surface to be cooled as liquid jets. Alternatively, any forced concurrent impingement of the first fluid and the second fluid onto the surface to be cooled could be employed. By impinging a fluorocarbon liquid jet onto the surface to be cooled, coupled with boiling of the fluorocarbon liquid, heat flux levels that would normally exceed the critical heat flux level and lead to thermal runaway conditions, can be accommodated. As noted above, the first fluid and the second fluid are immiscible, and concurrently separately injected to impinge upon the surface to be cooled (e.g., the back surfaces of the electronic devices illustrated in FIG. 2).

As shown in FIG. 2, a multi-fluid manifold structure 240 is secured to substrate 210, which together define a chamber 241 within which the surfaces to be cooled are exposed. Separate streams of fluorocarbon liquid and water are supplied to each surface to be cooled via two separate plenums, i.e., an inner plenum 250 and an outer plenum 260. As shown, water 254 (i.e., the second fluid) is delivered through annular jet openings 252 from inner plenum 250, while fluorocarbon liquid (i.e., the first fluid) is delivered through orifice nozzles 262 from outer plenum 260 onto the surface to be cooled.

Figure 2A:
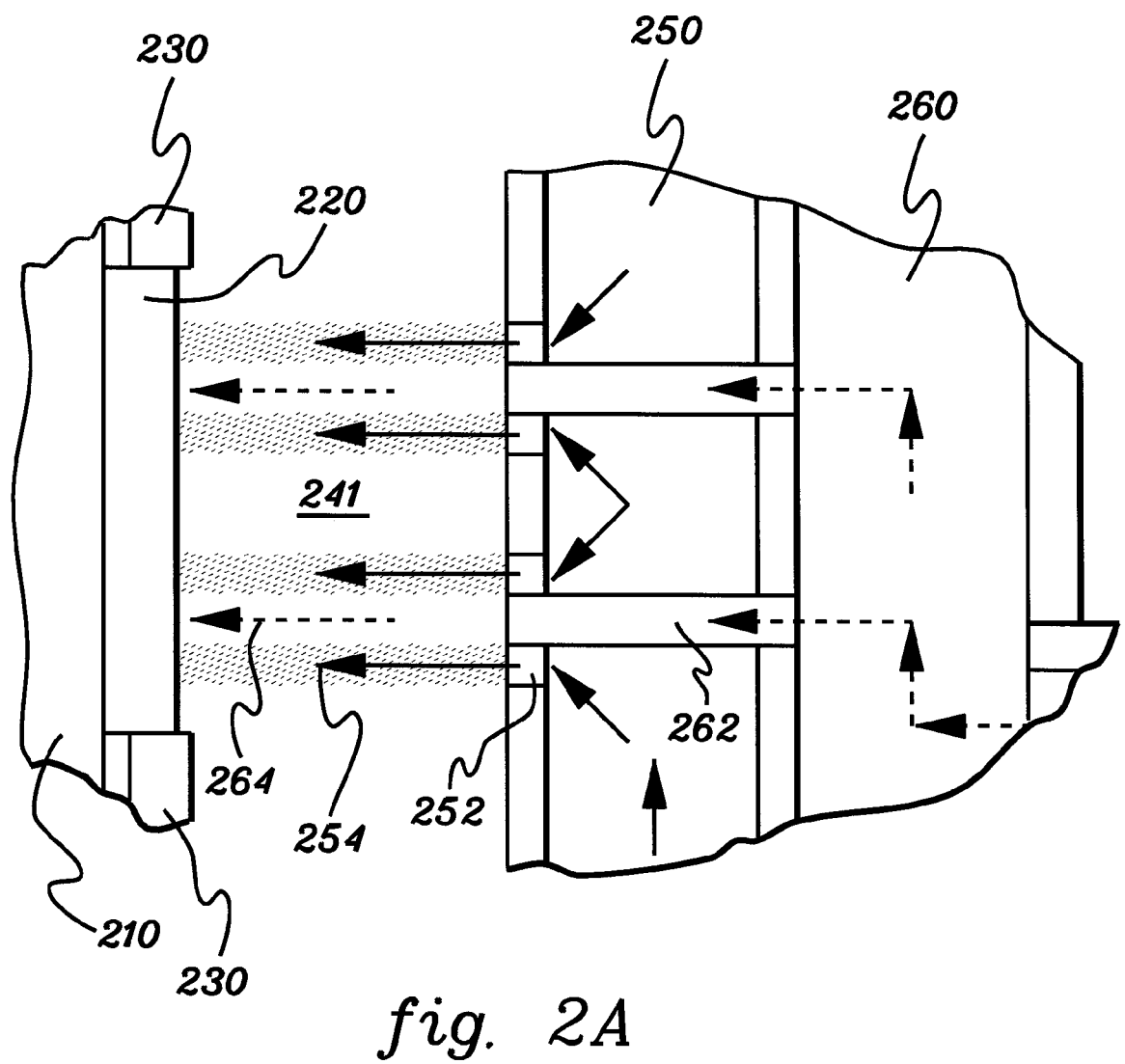
FIG. 2A is a partial enlarged view of the cooled electronic module of FIG. 2, in accordance with an aspect of the present invention.

As shown in greater detail in FIG. 2A, orifice nozzles 262 penetrate and project from a wall separating inner plenum 250 and outer plenum 260. These orifice nozzles 262 extend through inner plenum 250 and are centered in annular jet openings 252 in the plate separating inner plenum 250 from chamber 241, adjacent to the exposed surface to be cooled of electronic devices 220 resident on substrate 210 (and sealed by sealing plate 230). Circular fluorocarbon jets 264 issue from nozzle orifices 262 to provide cooling of the electronic devices. The fluorocarbon jets provide a boiling mode of cooling with a fraction of the fluorocarbon liquid being vaporized. The annular water jets 254 provide single-phase cooling, as well as provide contact condensation of the evolving fluorocarbon vapors.

Figure 3:
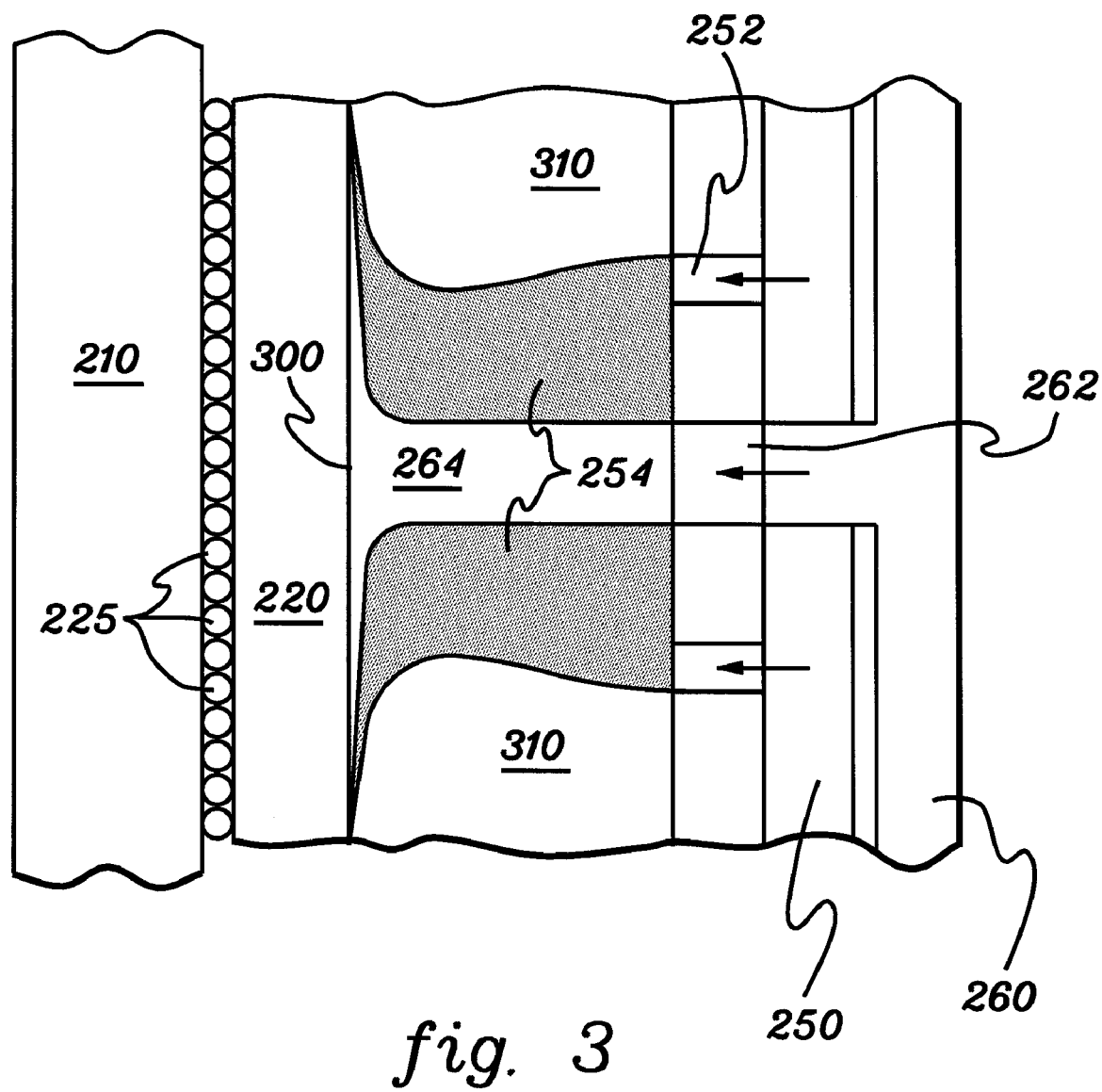
FIG. 3 is a partial cross-sectional elevational view of a cooled electronic module showing a first fluid and a second fluid being concurrently, separately injected onto a surface to be cooled of an electronic device, in accordance with an aspect of the present invention.

FIG. 3 depicts a further enlargement of the multi-fluid impingement approach described herein, wherein a first fluid stream 264 introduced through nozzle orifice 262 and a second fluid 254 introduced through annular orifice 252 are concentric streams of different liquid impinging on the surface to be cooled 300 of electronic device 220, which as shown in this figure, is electrically connected via C4 contacts 225 to substrate 210 metallurgy. First fluid 264 (such as fluorocarbon liquid) boils at a relatively low temperature and evolves vapor which upon contact with the surrounding second fluid (e.g., water) condenses and returns to the liquid phase. An emulsion 310 is produced within chamber 241 comprising globules of the first fluid and second fluid since the fluids are immiscible. The result is three principal zones of fluids being established between the manifold structure and the surface to be cooled, that is, one zone comprising first fluid 264, one zone comprising second fluid 254, and one zone comprising emulsion 310.

Figure 4:
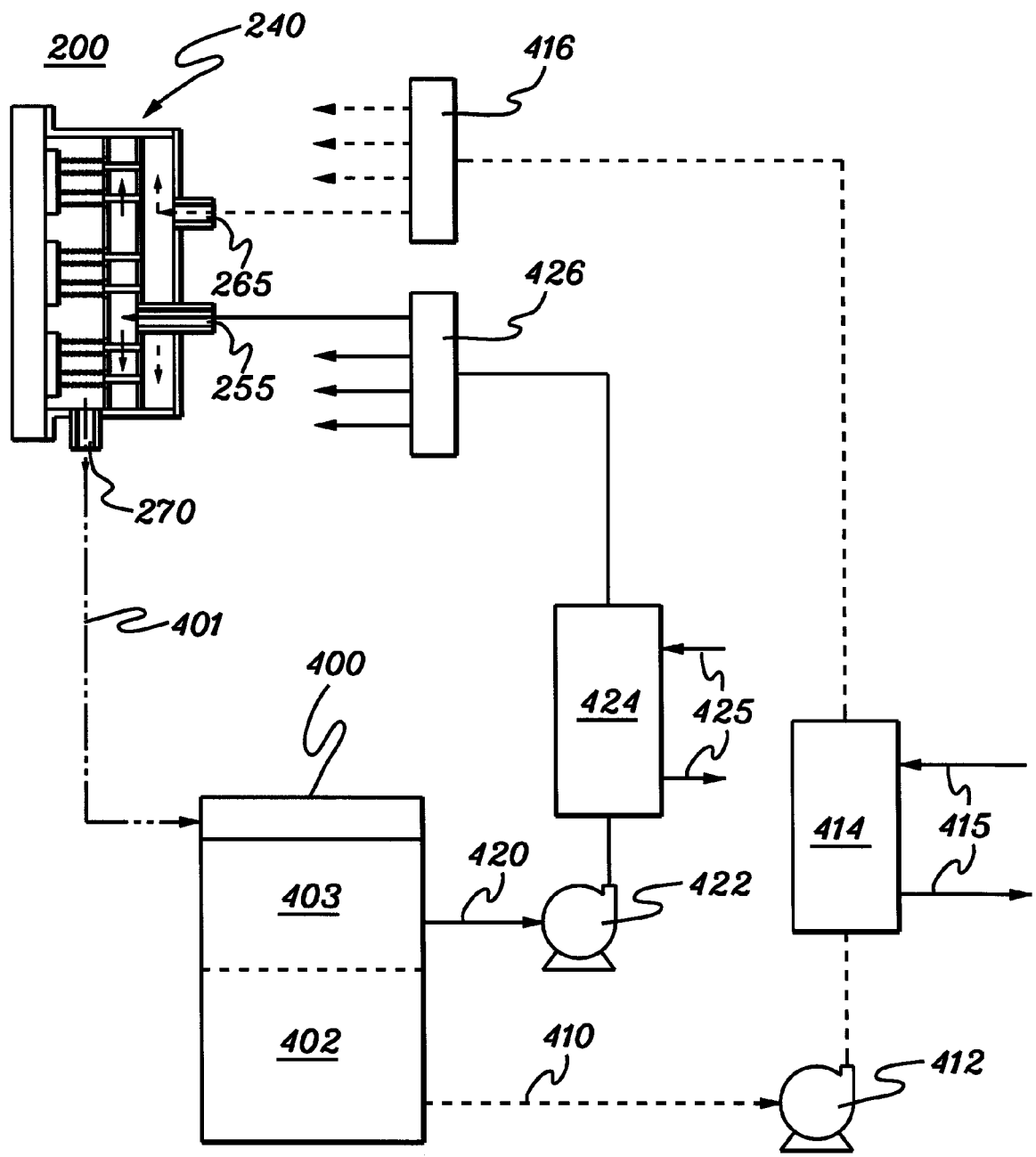
FIG. 4 depicts the cooled electronic module of FIGS. 2, 2A & 3 and further details of the cooling system therefore, in accordance with an aspect of the present invention.

As shown in FIG. 4, a multi-fluid outlet 270 is provided in a lower portion of the multi-fluid manifold structure for withdrawal of the emulsion or effluent via a single return line 401 to a separation tank 400. In one implementation, the surfaces to be cooled are oriented vertically ±10° to facilitate dropping of the emulsion to the bottom or lower portion of the chamber and exiting thereof through the multi-fluid outlet 270 to the separation tank via the return line. The emulsion exits as separate globules of fluorocarbon and water, which due to their immiscibility and different specific gravities, separate into two distinct layers or volumes 402 & 403 within separation tank 400, with fluorocarbon at the bottom of the tank and water at the top.

Separate exit pipes 410 & 420 are situated at two different levels of separation tank 400. One exit pipe 410 is situated near the bottom to deliver fluorocarbon to a pump 412 and hence to a first heat exchanger 414 to be cooled by liquid coolant 415 passing therethrough. The cooled hydrocarbon liquid is then returned to the multi-fluid manifold structure 240 of cooled electronic module 200 via, for example, a fluorocarbon supply manifold 416. One supply line from fluorocarbon supply manifold 416 connects to fluorocarbon inlet 265 of multi-fluid manifold structure 240. The other exit pipe 420 is situated at a level in separation tank 400 so that it is always above the water-fluorocarbon interface. Water is delivered through this pipe by a second pump 422 to a second heat exchanger 424, where it is cooled by a cooling liquid 425 passing therethrough. Water is then returned to the multi-fluid manifold structure 240 via, for example, a water supply manifold 426, with a supply line therefrom being connected to water inlet 255 of multi-fluid manifold structure 240. Heat exchangers 414 & 424 reject heat absorbed from the electronic devices to the respective liquid coolant 415, 425 supplied, for example, by a coolant conditioning unit or a customer coolant supply. Supply manifolds 416, 426 are employed to allow cooling of multiple electronic modules using common external cooling system components, such as separation tank 400, pumps 412, 422 and heat exchangers 414, 424.

As a further specific example, assume two fluids, one a refrigerant R-245fa and the other water, which are mutually immiscible, and impinge onto a surface to be cooled of an electronic device, where the R-245fa is permitted to boil and the water is maintained at or below the saturation temperature of R-245fa. In this example:

The heat transferred to the R-245fa by the heated surface via saturated nucleate boiling is subsequently transferred to the water via contact condensation, and the two liquid species are transported out of the module as an emulsion.

R-245fa is boiling in a saturated forced convection mode. To avoid film boiling and elevated surface temperatures (it is desirable to maintain a low wall superheat, thus limiting the boiling heat flux), relatively little interface between the liquid flow field and the generated vapor should occur for R-245fa vapor mass fractions of 20%-30% (local dry-out should be avoided).

The goal is to balance water and refrigerant flow such that a coherent refrigerant jet impinges on the target, then fully mixes with the water at a downstream location, while thermodynamically being balanced so that the module effluent is a two-species fluid-phase only mixture.

Assume the following representative fluid properties:

| R-245fa | Water |
|---|---|
| $\rho = 1338.8$ kg/m$^3$ | $\rho = 997$ kg/m$^3$ |
| $h_{fg} = 187$ kJ/kg | $C_p = 4.181$ kJ/kgK |
| $\mu = 405.3$ µPa-s | $\mu = 959$ µPa-s |
| $k = 0.09$ W/mK | $k = 0.606$ W/mK |

$T_{sat} = 30°$ C. (for an ambient pressure of 1.7 Atm)

Wherein:
ρ=density;
$C_p$=specific heat;
$h_{fg}$=latent heat of vaporization;
µ=dynamic viscosity; and
k=thermal conductivity.

The energy balance between the boiling R-245fa (saturated at 30° C.) and the water can be expressed subject to two conditions. The first condition is that:

$$T_{out, water} \leq T_{sat, R\text{-}245fa}$$

and is a necessary condition for both fluid species to exit as a liquid emulsion. The second condition is that:

$$q_{latent, R\text{-}245fa} = q_{sensible, water}$$

and expresses the minimum amount of heat that the water (i.e., the second fluid) must absorb such that the R-245fa (i.e., the first fluid) vapors fully condense. The energy balance is then expressed as:

$$x \dot{m}_{R\text{-}245fa} h_{fg} = \dot{m}_{water} C_p (T_{sat, R\text{-}245fa} - T_{in, water})$$

Wherein:
$T_{in, water}$=inlet water temperature;
$T_{out, water}$=output water temperature;
$T_{sat, R\text{-}245fa}$=temperature of R-245fa coolant at saturation;
$q_{latent, R\text{-}245fa}$=heat transfer to R-245fa as coolant vaporizes;
$q_{sensible, water}$=heat transfer to water by rising temperature;
x=vapor mass fraction (or quality);
$\dot{m}_{R\text{-}245fa}$=mass flow rate of R-245fa; and
$\dot{m}_{water}$=mass flow rate of water.

Assuming an R-245fa orifice diameter D=0.4 mm and an annular water jet with an inner diameter of 1.4 mm and outer diameter of 1.8 mm (0.2 mm width), and limiting the refrigerant jet to 5 m/s average velocity (to maintain reasonable pressure drop), the relationship reduces to:

$$x \frac{\dot{m}_{R\text{-}245fa}}{\dot{m}_{water}} = 0.2688 \Rightarrow \begin{array}{l} \text{for mass flow ratio of } v_{R\text{-}245fa} = 5.0 \text{ m/s} \\ 1.24, x = 0.216 \text{ and} \ldots \quad v_{water} = 0.675 \text{ m/s} \end{array}$$

At a 21.6% vapor mass fraction of R-245fa, the resulting heat dissipation from the target is 33.9 W. A Computational Fluid Dynamics (CFD) model of the single phase interaction between the two fluids was done to ensure that a coherent refrigerant jet reaches the surface and that downstream mixing occurs. (Two specie laminar steady state "implicit volume of fluid" calculation.)

Using superposition to combine the modeled single-phase heat transfer and the thermodynamically derived boiling heat transfer rate, a 6 mm diameter R-245fa wall jet is realized where nucleate boiling can occur (resulting in heat flux of 120 W/cm$^2$). The aggregate heat transfer rate utilizing multi-phase, multi-species flow is 166 W/cm$^2$, whereas the single-phase water (same model, water comprises both jets ΔT=48° C. inlet to surface), the heat transfer rate is 119.8 W/cm$^2$, meaning that an approximate 39% increase in performance is achieved over using water alone.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A cooling system comprising:
a multi-fluid manifold structure comprising at least one first fluid inlet orifice and at least one second fluid inlet orifice for concurrently separately injecting at least one first fluid stream and at least one second fluid stream towards a surface to be cooled to cool at least one electronic device comprising or coupled to the surface to be cooled; and
wherein the first fluid stream is a jet stream, remaining a coherent stream until impinging on the surface to be cooled, and the second fluid stream surrounds the first fluid stream, the first fluid and the second fluid being immiscible, and the first fluid having a lower boiling point temperature than the second fluid, and wherein the cooling system is employed to cool the at least one electronic device via, in part, the first fluid boiling upon impinging on the surface to be cooled, with evolving first fluid vapor condensing by direct contact with the second fluid stream of higher boiling point temperature.

2. The cooling system of claim 1, wherein the at least one first fluid inlet orifice and the at least one second fluid inlet orifice are concentric and the first fluid stream and the second fluid stream are concentric fluid streams directed towards the surface to be cooled, and evolving first fluid vapor condenses in situ over the surface to be cooled by direct contact with the second fluid stream of higher boiling point temperature.

3. The cooling system of claim 2, wherein the multi-fluid manifold structure comprises a plurality of first fluid inlet orifices and a plurality of second fluid inlet orifices, wherein each first fluid inlet orifice of the plurality of first fluid inlet orifices is concentric with a respective second fluid inlet orifice of the plurality of second fluid inlet orifices, and wherein each second fluid inlet orifice comprises an annular orifice surrounding the respective first fluid inlet orifice.

4. The cooling system of claim 1, wherein the at least one first fluid inlet orifice comprises at least one first fluid inlet jet orifice and the at least one second fluid inlet orifice comprises at least one second fluid inlet jet orifice, and wherein the at least one first fluid inlet jet orifice provides continuous impingement of the first fluid stream onto the surface to be cooled to cool the at least one electronic device, and concurrent therewith the at least one second fluid inlet jet orifice provides continuous impingement of the second fluid stream onto a boundary layer of the first fluid stream formed as a result of the first fluid stream impinging on the surface to be cooled.

5. The cooling system of claim 1, wherein the first fluid is one of a fluorocarbon or a refrigerant and the second fluid is water, and wherein the at least one electronic device comprises at least one of an integrated circuit chip, multiple integrated circuit chips, an electronic component or multiple electronic components.

6. The cooling system of claim 1, wherein the first fluid and the second fluid have different densities, and the surface to be cooled is aligned within a range of ±10° of a vertical orientation, and wherein the cooling system further comprises a multi-fluid outlet in a lower region of the multi-fluid manifold structure through which an emulsion comprising the first fluid and the second fluid is withdrawn, and wherein the cooling system further comprises a multi-fluid return line coupling the multi-fluid outlet to a separation tank where the first fluid and the second fluid in the emulsion separate, based on their immiscibility and different densities, for subsequent return to the multi-fluid manifold structure.

7. The cooling system of claim 6, further comprising a first pump for pumping the first fluid from the separation tank through a first heat exchanger to the multi-fluid manifold structure and a second pump for pumping the second fluid from the separation tank through a second heat exchanger to the multi-fluid manifold structure, and wherein the first fluid stream and the second fluid stream have different mass flow rates towards the surface to be cooled.

8. A cooled electronic module comprising:
a substrate;
at least one electronic device coupled to the substrate; and
a cooling system for cooling the at least one electronic device, the cooling system comprising:
a multi-fluid manifold structure comprising at least one first fluid inlet orifice and at least one second fluid inlet orifice for concurrently separately injecting at least one first fluid stream and at least one second fluid stream towards a surface to be cooled to cool the at least one electronic device comprising or coupled to the surface to be cooled; and
wherein the first fluid stream is a jet stream, remaining a coherent stream until impinging on the surface to be cooled, and the second fluid stream surrounds the first fluid stream, the first fluid and the second fluid being immiscible, and the first fluid having a lower boiling point temperature than the second fluid, and wherein the cooling system is employed to cool the at least one electronic device via, in part, the first fluid, boiling upon impinging on the surface to be cooled, with evolving first fluid vapor condensing by direct contact with the second fluid stream of higher boiling point temperature.

9. The cooled electronic module of claim 8, wherein the multi-fluid manifold structure coupled to the substrate defines a chamber within which the surface to be cooled is disposed, and wherein the at least one first fluid inlet orifice and the at least one second fluid inlet orifice are concentric and the first fluid stream and the second fluid stream are concentric fluid streams directed towards the surface to be cooled, and evolving first fluid vapor condenses in situ within the chamber by direct contact with the second fluid stream of higher boiling point temperature.

10. The cooled electronic module of claim 9, wherein the multi-fluid manifold structure comprises a plurality of first fluid inlet orifices and a plurality of second fluid inlet orifices, and wherein each fluid inlet orifice of the plurality of first fluid inlet orifices is concentric with a respective second fluid inlet orifice of the plurality of second fluid inlet orifices, and wherein each second fluid inlet orifice comprises an annular orifice surrounding the respective first fluid inlet orifice.

11. The cooled electronic module of claim 10, wherein the plurality of first fluid inlet orifices comprise a plurality of first fluid inlet jet orifices and the plurality of second fluid inlet orifices comprise a plurality of second fluid inlet jet orifices, and wherein the plurality of first fluid inlet jet orifices provide continuous impingement of the first fluid stream onto the surface to be cooled concurrent with the plurality of second fluid inlet jet orifices providing continuous impingement of the second fluid stream onto a boundary layer of the first fluid stream formed as a result of the first fluid stream impinging on the surface to be cooled.

12. The cooled electronic module of claim 9, wherein the first fluid is one of a fluorocarbon or a refrigerant, the second fluid is water, and the chamber is at atmospheric pressure, and wherein the at least one electronic device comprises at least one of an integrated circuit chip, multiple integrated circuit chips, an electronic component or multiple electronic components.

13. The cooled electronic module of claim 8, wherein the first fluid and the second fluid have different densities, and the surface to be cooled is aligned within a range of ±10° of a vertical orientation, and wherein the cooling system further comprises a multi-fluid outlet in a lower region of the multi-fluid manifold structure for withdrawing an emulsion of the first fluid and the second fluid, and wherein the cooling system further comprises a multi-fluid return line coupling the multi-fluid outlet to a separation tank where the first fluid and the second fluid in the emulsion separate, based on their immiscibility and different densities, for subsequent return to the multi-fluid manifold structure.

14. The cooled electronic module of claim 13, further comprising a first pump for pumping the first fluid from the separation tank through a first heat exchanger to the multi-fluid manifold structure and a second pump for pumping the second fluid from the separation tank through a second heat exchanger to the multi-fluid manifold structure, wherein the first heat exchanger cools the first fluid to a first temperature and the second heat exchanger cools the second fluid to a second temperature, and wherein the first fluid stream and the second fluid stream have different mass flow rates towards the surface to be cooled.

* * * * *